United States Patent
Solmeyer et al.

(10) Patent No.: US 10,571,269 B1
(45) Date of Patent: Feb. 25, 2020

(54) CIRCULAR RESONATOR EVANESCENT-WAVE TRAPPED ATOMIC GYROSCOPE

(71) Applicant: Honeywell International Inc., Morris Plains, NJ (US)

(72) Inventors: Neal Eldrich Solmeyer, Edina, MN (US); Karl D. Nelson, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/275,269

(22) Filed: Feb. 13, 2019

(51) Int. Cl.
*G01C 19/58* (2006.01)
*H03B 17/00* (2006.01)
*H03L 7/26* (2006.01)
*G01B 9/02* (2006.01)

(52) U.S. Cl.
CPC .............. *G01C 19/58* (2013.01); *G01B 9/02* (2013.01); *H03B 17/00* (2013.01); *H03L 7/26* (2013.01)

(58) Field of Classification Search
CPC ........ G01C 19/58; G01C 19/62; G01C 21/16; H03B 17/00; H03L 7/26; G01B 9/00; G01B 9/02
See application file for complete search history.

(56) References Cited

U.S. PATENT DOCUMENTS

| | | | |
|---|---|---|---|
| 9,766,071 B2* | 9/2017 | Compton | G01C 19/60 |
| 9,887,019 B2* | 2/2018 | Compton | G21K 1/006 |
| 2015/0015251 A1 | 1/2015 | Bulatowicz | |
| 2016/0298967 A1 | 10/2016 | Johnson et al. | |
| 2018/0211739 A1 | 7/2018 | Ovchinnikov | |
| 2018/0267479 A1 | 9/2018 | Kotru et al. | |

OTHER PUBLICATIONS

Armani et al. "Ultra-high-Q toroid microcavity on a chip", Nature vol. 421, Published Feb. 27, 2003, pp. 925-928.
Benson et al. "Micro-Optical Resonators for Microlasers and Integrated Optoelectronics: Recent advances and future challenges", Frontiers of Planar Lightwave Circuit Technology: Design, Simulation and Fabrication, Publisher: Springer, Published Aug. 2005, pp. 40-70.
Rosenblit et al. "Design of microcavity resonators for single-atom detection", Journal of Nanophotonics, Published Jan. 2007, pp. 1-13.

* cited by examiner

*Primary Examiner* — David E Smith
(74) *Attorney, Agent, or Firm* — Fogg & Powers LLC (57) ABSTRACT

Methods and apparatuses are provided for determining rate of rotation around a center axis of circular resonator by trapping cold alkali atoms around the circular resonator and utilizing Raman or Bragg interferometry.

20 Claims, 4 Drawing Sheets

CIRCULAR RESONATOR EVANESCENT-WAVE TRAPPED ATOMIC GYROSCOPE

BACKGROUND

A gyroscope is used to determine rate of rotation around an axis. However, conventional gyroscopes such as resonant fiber optic gyroscopes have limited sensitivity to rotation. Some applications demand higher rotation sensitivity.

Gyroscopes based upon atomic interferometers have higher rotation sensitivity. However, existing gyroscopes based upon atomic interferometers typically do not satisfy size, weight, power and cost (SWAP-C) requirements of many applications. Further, such systems cannot be cost effectively mass manufactured because their performance requires significant adjustment upon construction. Also, such systems' performance is susceptible to environmental factors so that their performance can vary, and thus is not repeatable; hence, such systems do not meet application stability requirements. As a result, current gyroscopes based upon atomic interferometers do not meet the requirements of many modern applications.

Therefore, there is a need for a gyroscope based upon atomic interferometers that will satisfy customer SWAP-C and stability requirements, and which can be cost effectively mass produced.

SUMMARY

A method is provided. The method comprises: condensing cold alkali atoms around a circumferential surface of a circular resonator; trapping alkali atoms and their respective atomic wave function around the circumferential surface of the circular resonator and displaced from the circumferential surface of the circular resonator; coupling a first set of at least one optical pulse to the circular resonator; wherein the first set of at least one optical pulse has an amplitude, phase, and frequency so that a first evanescent field is created around the circumferential surface of the circular resonator which splits the atomic wave function of the alkali atoms into two portions; wherein one portion has a first state and the other portion has a second state; allowing the portions of the atomic wave function to propagate at least once around the circumferential surface of the circular resonator; coupling a second set of at least one optical pulse to the circular resonator; wherein the second set of at least one optical pulse has an amplitude, phase, and frequency so that a second evanescent field is created around the circumferential surface of circular resonator which causes the two states of the atomic wave function of the alkali atoms to have a ratio dependent upon a rate of rotation around a center axis of the circular resonator; coupling a third set of at least one optical pulse to the circular resonator; wherein the third set of at least one optical pulse has an amplitude, phase and frequency so that the amplitude or the phase of transmitted light or the amplitude of scattered light are dependent on a population ratio of the two portions of the atomic wave function of the alkali atoms; measuring at least one of an optical amplitude and an optical phase of the third set of the at least one optical pulse that have been at least one of: transmitted and scattered by the circular resonator; determining a phase shift between the two portions of the atomic wave function corresponding to a rate of rotation around the center axis of the circular resonator around the center axis based upon the at least one an optical amplitude and optical phase measured by the at least one optical detector; and determining a rate of rotation using the determined phase shift.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments. Reference characters denote like elements throughout figures and text.

DETAILED DESCRIPTION

In the following detailed description, reference is made to the accompanying drawings that form a part hereof, and in which is shown by way of illustration specific illustrative embodiments. However, it is to be understood that other embodiments may be utilized, and that structural, mechanical, and electrical changes may be made. Furthermore, the method presented in the drawing figures and the specification is not to be construed as limiting the order in which the individual steps may be performed. The following detailed description is, therefore, not to be taken in a limiting sense.

A circular resonator evanescent-wave trapped atomic gyroscope may be used to overcome the above referenced problem. Embodiments of the circular resonator evanescent-wave trapped atomic gyroscope has advantages that is smaller, more stable, more cost effective to manufacture, and consumes less power than alternative gyroscopes including other atomic gyroscopes.

The circular resonator evanescent-wave trapped atomic gyroscope operates by generating a source of cold alkali atoms around a circular resonator. A first continuous wave (CW) optical signal and a second CW optical signal are optically coupled to the circular resonator. The frequencies of the first CW optical signal and the second CW optical signal are respectively just below and just above a resonant frequency of the alkali atoms. Each resonant frequency of the alkali atoms is a frequency at which optical energy causes electrons of the alkali atoms to change electronic states. Further, the first and second CW signals have frequencies substantially equal to a resonant frequency of the circular resonator to increase the amount of energy of the first and second CW signals coupled to the circular resonator. The first and second CW signals, coupled to the circular resonator, have evanescent fields around the circumferential surface of the circular resonator.

As a result, the first CW optical signal attracts alkali atoms (and their atomic wave function), and the second CW optical signal repels the alkali atoms (and their atomic wave function). Because the intensity, or power, of the evanescent field of the second CW optical signal (having the higher frequency) decays faster than the evanescent field of the intensity, or power, of the first CW optical signal (having the lower frequency), the alkali atoms (and their respective atomic wave function) are trapped around the circumferential surface of the circular resonator and at a distance or displaced from the circumferential surface of the circular resonator. The distance from the surface may range from between 50 nm and 300 nm; however, this range is exemplary, and the range of distance may vary depending upon the alkali element used, the design of the circular resonator, and/or the intensities or frequencies of the first and second first and second evanescent CW optical signals. The evanescent fields of the first CW optical signal and the second CW optical signal may be also referred to herein as a red blue optical evanescent trap.

A first set of one or more optical pulses is coupled to the circular resonator. Optionally, the first set of one or more optical pulses has a fundamental frequency substantially equal to a resonant frequency of the circular resonator to increase the amount of energy of the first set coupled to the circular resonator. The first set of one or more optical pulses, coupled to the circular resonator, has an evanescent field around the circumferential surface of the circular resonator. Upon selecting appropriate amplitude, phase and frequency of the first set of pulses, the evanescent field of the first set of one or more optical pulses incident upon the cold alkali atoms splits the atomic wave function of the alkali atoms into two portions. The amplitude, phase, and frequency of the first set of pulses necessary to split the atomic wave function of the alkali atoms into two portions can be determined using the Schrôdinger equation. The design of the first set of one or more optical pulses may differ for Bragg and Raman atomic interferometers. In a Bragg atomic interferometer, the optical pulses are designed to split the two portions of the atomic wave function into different motional states, retaining the same electronic state. In a Raman atomic interferometer, the optical pulses are designed to split the two portions of the atomic wave function into different electronic states and different motional states.

Because they are caught in the red blue optical evanescent trap, for example each portion of the atomic wave function propagates in an opposite direction—around the circumferential surface of the circular resonator—from the other portion, e.g. clockwise and counter clockwise. Each portion of the atomic wave function has at least one different state, e.g. an electronic and motional state (corresponding to a Raman atomic interferometer) or a motional state (corresponding to a Bragg atomic interferometer). Electronic state means electron energy level in an atom, e.g. in the alkali atom. Motional state means direction of travel, e.g. clockwise and counter clockwise, around the circular resonator, and the momentum of the state. As the number of pulses of the first set is increased, each portion of the atomic wave function can travel more times around the circumferential surface of the circular resonator.

After a time, a second set of one or more optical pulses is coupled to the circular resonator. The time between the first and second set of one or more optical pulses can be tens to hundreds of milliseconds depending on the desired sensitivity, size of the circular resonator, and number of pulses in the first set of optical pulses. The second set of one or more optical pulses has a fundamental frequency substantially equal to a resonant frequency of the circular resonator to increase the amount of energy of the second set coupled to the circular resonator. The second set of one or more optical pulses, coupled to the circular resonator, has an evanescent field around the circumferential surface of the circular resonator. The design of the second set of one or more optical pulses may differ for Bragg and Raman atomic interferometers. The second set of optical pulses are designed to re-combine the split atomic wave functions produced from the first set of optical pulses. The spectral content of the first and the second sets of optical pulses as well as there the intensity and duration may differ between the two schemes.

The evanescent field of second set of pulse(s) causes the atomic wave function of the alkali atoms to have to a particular ratio of a population of the first state to a population of a second state. For example, if there is no rotation around a center axis of the circulating atomic wave function (center axis), e.g. center axis of the circular resonator, the ratio may be, e.g. one to one or one to zero depending upon the amplitude, phase and frequency of the second set of pulses. The amplitude, phase, and frequency of the second set of pulses and the ratio of populations at zero rotation can be determined using the Schrödinger equation.

The system described herein acts as an atomic interferometer because if there is rotation around the center axis, a phase shift φ is created between the two portions of the atomic wave function, and that phase shift is mapped onto a ratio of populations by the second set of pulses.

Subsequently, a third set of one or more optical pulses is coupled to the circular resonator. The third set of one or more optical pulses has a fundamental frequency of the circular resonator substantially equal to a resonant frequency of the circular resonator to increase the amount of energy of the third set coupled to the circular resonator. The third set of one or more optical pulses, coupled to the circular resonator, has an evanescent field around the circumferential surface of the circular resonator. The design of the third set of one or more optical pulses may differ for Bragg and Raman atomic interferometers. The third set of optical pulses is designed so that the amplitude and/or the phase of the pulses, after interacting with the atoms, is dependent on the population ratio of the alkali atoms. For example, in the Bragg atomic interferometer, the third set of optical pulses is designed to distinguish between two motional states of the atoms, whereas in the Raman atomic interferometer, the third set of optical pulses may be designed to be resonant with the two different electronic states of the atomic wave function.

If there has been rotation around the center axis, the population ratio of the atomic states between the two portions of the atomic wave function differs as a result of the different phase shift created on the atomic wave function. As a result, the amplitude and the phase of the third set of one or more optical pulses, transmitted thereafter to a detector, is altered. For example, in the Bragg interferometer, the third set of optical pulses may be closer to the resonant frequency of one of the portions of the atomic wave function than to the other portion, as a result of the Doppler shift difference between two portions moving at different velocities. As a result, the third set of optical pulses will interact more strongly with one portion than the other portion, making the absorption or the phase retardation of the third set of optical pulses dependent on the population ratio of the atomic wave function. However, for example, in the Raman atomic interferometer, the third set of optical pulses may be resonant with one of the electronic states of the portion of the atomic wave function, and not the other portion, so that the absorption or the phase retardation of the third set of optical pulses is dependent on the population ratio of the atomic wave function. The dependence of the absorption or the phase retardation of the third set of optical pulses on the population of the atomic wave function can be determined with the Schrödinger equation. The term component may be used interchangeably with the term portion.

The change in amplitude (with respect to amplitude with no rotation) of absorbed and/or scattered energy, and/or the change in phase (with respect to phase with no rotation) of transmitted energy can be used to determine the relative populations of the two states. The populations of states and the amplitude are related to the phase shift φ by a periodic sinusoidal wave function: $C*\sin^2(\varphi)$ function, where C is a constant. Because the change in population (between no rotation and rotation around the center axis) is measured by relating the change in absorption or phase retardation of the third set of optical pulses to the population ratio, the phase shift φ between the two portions of the wave function can be readily determined. Using the Sagnac equation, the rate of rotation (Ω) around the center axis can be determined:

$$\Omega = \frac{\varphi h}{4\pi m A},$$ (Equation 1)

where m is the mass of the alkali atom, A is the cross-sectional area enclosed by circulating atomic wave function, and h is Planck's constant.

Figure 1A:
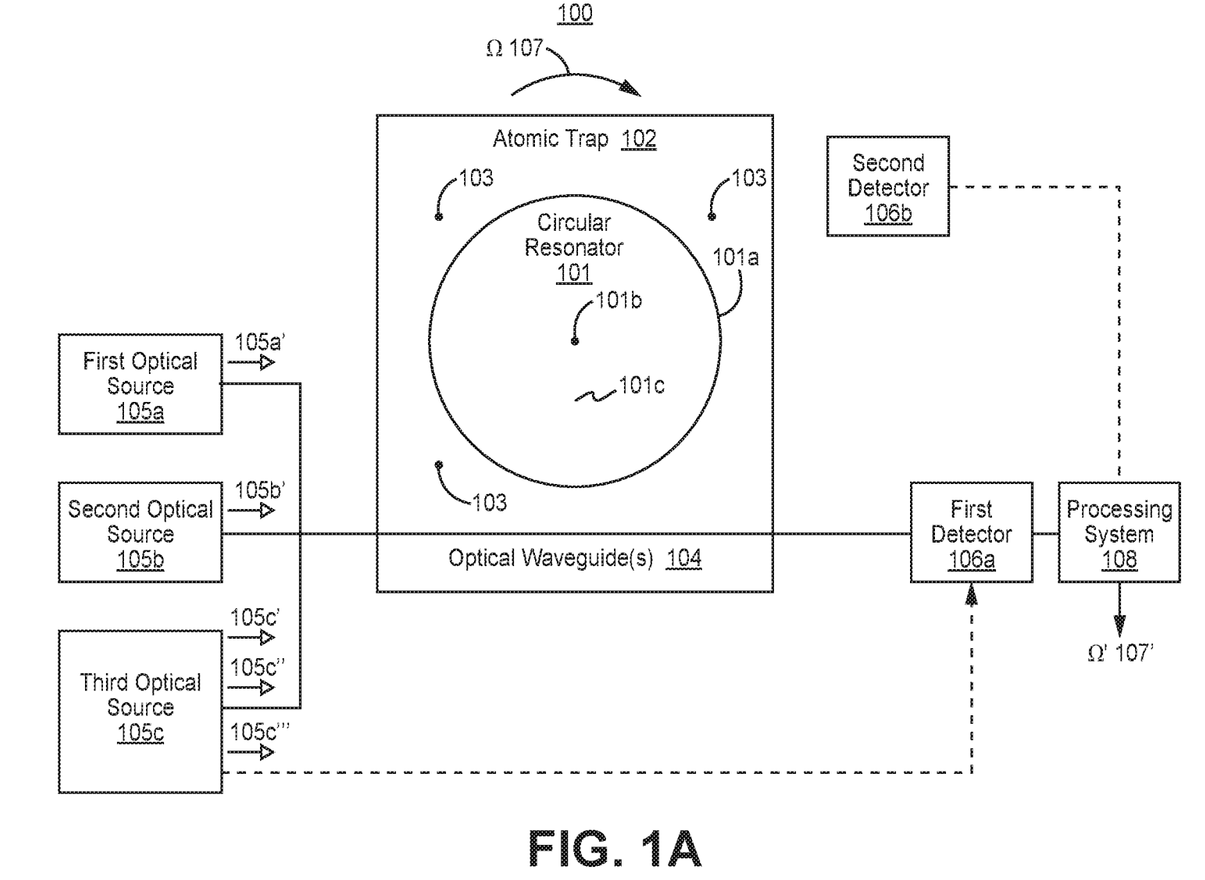
FIG. 1A illustrates a block diagram of one embodiment of a circular resonator evanescent-wave trapped atomic gyroscope.

FIG. 1A illustrates a block diagram of one embodiment of a circular resonator evanescent-wave trapped atomic gyroscope (atomic gyroscope) 100. The atomic gyroscope 100 comprises a circular resonator 101, an atomic trap 102, alkali atoms 103, at least one optical waveguide (optical waveguide(s)) 104, a first optical source 105a, a second optical source 105b, a third optical source 105c, a first optical detector 106, and a processing system 108. Optionally, the optical sources described herein, e.g. referred to above, can be combined into one or more optical sources. The optical detectors described herein may also be referred to as an optical detector circuit.

The first optical detector 106a may be an amplitude detector (e.g. comprising one or more photodiodes and optionally a differentially amplifier coupled to the output of two photodiodes) and/or a phase detector, e.g. an interferometer. The first optical source 105a, the second optical sources 105b, and/or the third optical source 105c are optically coupled to the at least one optical waveguide 104. The first optical source 105a, the second optical sources 105b, and/or the third optical source 105c may each be coupled to the at least one optical waveguide 104 with an optical coupler or by attaching the source to an end of the at least one optical waveguide 104. Each optical source comprises at least one CW and/or pulsed laser. Optionally, the processing system 108 may comprise processing circuitry coupled to memory circuitry.

The circular resonator 101 means an optical resonator in which light travels substantially in a non-free space medium in a closed path. A circular resonator may be, without limitation, a disc resonator, a toroidal resonator, a race track resonator, or any other doubly connected geometric shaped optical resonator. The toroidal resonator can have a higher Q factor than a comparable disc resonator which is preferable. The higher Q factor permits more energy to be coupled to and from the circular resonator 101 which enhances the sensitivity of the atomic gyroscope 100.

Figure 1B:
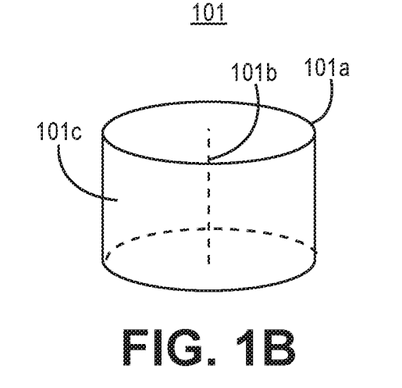
FIG. 1B illustrates a view of one embodiment of a circular resonator.

FIG. 1B illustrates a view of one embodiment of a circular resonator 101. The circumferential surface 101c is illustrated in FIG. 1B.

The circular resonator 101 may be formed in a semiconductor substrate. Semiconductor substrates as used herein include silicon semiconductor substrates which may be processed using conventional semiconductor manufacturing techniques.

Alkali atoms 103 are contained within the atomic trap 102. The alkali atoms 103 may be one of, e.g. rubidium or cesium atoms; however, the alkali atoms 103 may be one of any other type of alkali atoms.

The circular resonator 101 has a resonant frequency substantially equal to a resonant frequency corresponding to a change in electron energy levels of the atomic wave function of the alkali atoms 103. For example, a resonant frequency associated with a change in electron energy levels of rubidium has a wavelength of 780 nm.

The atomic trap 102 may be, e.g. a magneto-optical trap or an optical dipole trap that encloses the circular resonator 101. Optionally, the atomic trap 102 comprises at least one laser. The atomic trap 102 concentrates, e.g. in a Bose-Einstein condensate or cold thermal ensemble, the alkali atoms 103 around a surface of the circumference 101a of the circular resonator 101. Note, the term circumference as used herein means perimeter and is not limited to a specific shape such as a circle. If the atomic trap 102 is a magneto-optical trap, then the atomic trap 102 can be enabled and disabled by respectively activating and deactivating three orthogonal light beams intersecting about the center of the circumference 101a of the circular resonator, and a DC magnetic field—across the circular resonator—in the atomic trap 102. The atomic trap 102 includes a vacuum chamber which contains the alkali atoms 103, the circular resonator 101, and optionally at least a portion of the at least one optical waveguide 104.

The first optical source 105a and the second optical source 105b respectively generate the aforementioned first CW optical signal 105a' and second CW optical signal 105b'. If alkali atoms that are rubidium atoms are used, then for example the first CW optical signal 105a' and the second CW optical signal 105b' may have wavelengths of respectively greater than or equal to 790 nm and less than or equal to 770 nm. However, other wavelength ranges may be used.

The first optical source 105a and the second optical source 105b are coupled to the at least one optical waveguide 104. The first CW optical signal 105a' and the second CW optical signal 105b' are coupled to and propagate through the at least one optical waveguide 104 to the circular resonator 101. The at least one optical waveguide 104 may be an optical fiber or a waveguide formed in a substrate, e.g. a semiconductor substrate.

The at least one optical waveguide 104 may be a single optical waveguide as illustrated in FIG. 1A, or two or more optical waveguides. Optionally, each optical source 105a, 105b, 105c, and the first optical detector 106a may be coupled to the circular resonator 101 by a separate optical waveguide. Regardless of the number of optical waveguides used, to facilitate efficient optical coupling of optical signals from the at least one optical waveguide 104 to the circular resonator 101, at least a portion of each of such optical waveguides is desirably parallel to a portion of the circumferential surface of the circular resonator 101—as illustrated in FIG. 1A. Further, because the frequencies of the first CW optical signal 105a' and the second CW optical signal 105b' are relatively close to a resonant frequency of the circular resonator 101, a large amount of the energy of the first CW optical signal 105a' and the second CW optical signal 105b' is coupled to the circular resonator 101.

The atomic trap 102 is activated prior to the first optical source 105a and the second optical source 105b. Subsequently, the red blue optical evanescent trap is activated by generating the first CW optical signal 105a' and second CW optical signal 105b'. Operation of the atomic trap 102 and red blue optical evanescent trap overlap for a period of time, e.g. for between 1 microsecond to 300 milliseconds, after which the atomic trap 102 is disabled. As a result, the alkali atoms 103 are concentrated around the circumferential surface of the circular resonator 101, and then trapped around the circumferential surface and displace from the circumferential surface by a fixed distance, e.g. 25-100 nm or 50 nm.

The atomic gyroscope 100 utilizes an atomic interferometer. The atomic interferometer either operates as a Raman atomic interferometer or a Bragg atomic interferometer. As discussed elsewhere herein, for the Raman atomic interferometer, each portion of the atomic wave function has a different electronic state, and for the Bragg atomic interferometer, each portion of the atomic wave function has a different motional state.

The Raman atomic interferometer embodiment will first be described. Subsequently, the third optical source 105c generates the first set of one or more optical pulses 105c'. The first set of one or more optical pulses 105c' is coupled to the optical waveguide 104, and then coupled to the circular resonator 101. The first set of one or more pulses 105c' splits the atomic wave function of the alkali atoms 103 into two portions. The first set of one or more optical pulses 105c' contains two sets of one or more pulses each having a different fundamental frequency. The difference of fundamental frequencies is proximate to a resonant frequency of a transition to the second state, i.e. the second electronic state. Each fundamental frequency is proximate to a resonant frequency of the circular resonator 101 to enhance the energy coupled from the optical waveguide 104 to the circular resonator 101. The amplitudes, phases, and fundamental frequencies of the two sets of one or more optical pulses 105c' may be selected using the Schrödinger equation so that one or both portions of the wave function may circulate around the circumferential surface of the circular resonator 101. For pedagogical purposes, two portions propagating in opposite directions around the circumferential surface of the circular resonator 101 will be described.

Subsequently, the third optical source 105c generates the second set of one or more optical pulses 105c''. The second set of one or more optical pulses 105c'' is coupled to the optical waveguide 104, and then coupled to the circular resonator 101. If there is no rotation around the center axis of the circulating atomic wave function, e.g. around the center axis 101b of the circular resonator 101, the two portions of the atomic wave function combine forming an atomic wave function having the first state, i.e. first electronic state; thus, the population of the first state is one hundred percent, and the population of the second state is zero percent. However, if there is rotation around the center axis 101b of the circular resonator 101, the second set of optical pulses will produce a different population ratio of the atomic states dependent on the atomic phase φ created by the rotation. The population of the first state will be less than one hundred percent, and the population of the second state will be greater than zero percent. The relative populations of the two states can be ascertained and used to determine the rate of rotation 107 around the center axis 101b.

To determine the relative population, the third optical source 105c generates the third set of one or more optical pulses 105c'''. The third set of one or more optical pulses 105c''' has a fundamental frequency substantially equal to a resonant frequency that changes electrons from the first electronic state to the second electronic state.

In one embodiment, the third set of one or more optical pulses 105c' is coupled to the optical waveguide 104, and then coupled to the circular resonator 101. Optionally, the third set of one or more optical pulses 105c''' is also coupled, e.g. terminating the at least one optical waveguide 104 or using an optical coupler, to the first optical detector 106. The first optical detector 106a can measure the amplitude of the third set of one or more optical pulses 105e'' on an end of the at least one optical waveguide 104 on the other side of the circular resonator 101 from the third optical source 105c, and optionally the amplitude of the third set of one or more optical pulses 105c''' emitted by the third optical source 105c; optionally, the amplitude of the third set of one or more optical pulses 105c''' emitted by the third optical source 105c can be programmed or stored in the first optical detector 106a. Optionally, the third set of one or more optical pulses 105c''' emitted by the third optical source 105c may be extracted by an optical coupler, e.g. before the at least one optical waveguide 104 and after the third optical source 105c.

The first optical detector 106a can determine the relative amplitude (e.g. a percentage with respect to the amplitude of the third set emitted by the third optical source 105c) of the third set of one or more optical pulses 105c''' that is transmitted from the circular resonator 101 (and e.g. received by the first optical detector 106a). The difference between the amplitude of the third set emitted by the third optical source and transmitted by the circular resonator 101 corresponds to the ratio of the population of the first and second electronic states. This data can be conveyed to the processing system 108; an output of the first detector 106a is coupled to an input of the processing system 108. The populations of the first and second electronic states and the relative detected amplitude are related to the phase shift φ between both electronic states by a periodic sinusoidal wave function described above. Thus, the processing system can use the relative amplitude to determine the phase shift phase shift φ with respect to the peak amplitude. Knowing the phase shift φ caused by the rotation rate, the processing system can determine the rate of rotation Ω, using the Sagnac equation.

Optionally, the atomic gyroscope 100 comprises a second detector 106b proximate to, e.g. above, a surface 101c (having a circular surface area) of the circular resonator 101 that is co-planar with the circumference 101a. The second detector 106b may be in addition to or in lieu of the first detector 106a. The second detector 106b detects energy light scattered, e.g. fluoresced, from the atoms 103 trapped around the circular resonator 101. The amount of light scattered from the atoms is dependent on the atomic state. Thus, by knowing the scattered light energy compared to the energy of scattered light with no rotation, the population ratio of the atomic wave function can be determined. Correspondingly, the rotation rate Ω can be determined as described above.

Alternatively, the rate of rotation Ω can be determined by measuring the change of phase or amplitude (with respect to a rate of rotation of zero) of the third set of one or more optical pulses 105e'' that is transmitted from the circular resonator 101 and received by the first optical detector 106a. The dependence of the resonant frequency on the populations of the two states can be determined using quantum electrodynamics, e.g. the Jaynes Cummings model. The transmission of the third set of optical pulses then depends on the population ratio of the atomic states, due to the changing resonance frequency of the circular resonator.

The implementation of the Bragg interferometer is analogous to that of the Raman interferometer but with some modifications. The second set of one or more optical pulses 105c" causes there to be a population of atomic wave function at rest (i.e. no movement) corresponding to no rate of rotation, and a population of the atomic wave function that continues to move (i.e. around the circumference 101a) corresponding to a rate of rotation. The effective resonance frequencies of the atomic states are different as a result of the Doppler shift so the third set of one or more optical pulses 105c''' can be analyzed above to determine the rate of rotation Ω. The characteristics of the first, second, and third set of one or more optical pulses 105c', 105c", 105e" can be determined for the Bragg interferometer as discussed above for the Raman interferometer.

Figure 1C:
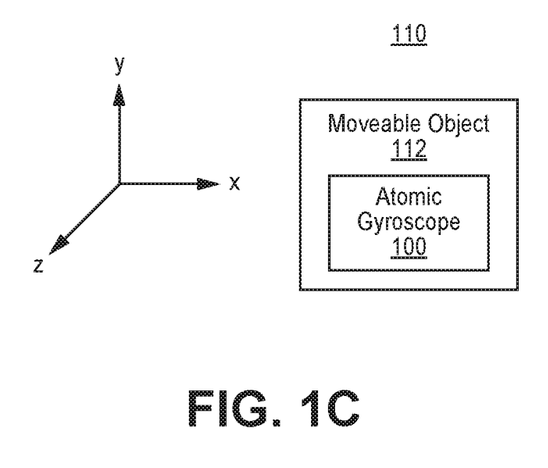
FIG. 1C illustrates an example of system comprising a moveable body including at least one circular resonator evanescent-wave trapped atomic gyroscope.

FIG. 1C illustrates an example of system 110 comprising a moveable body 112 including at least one circular resonator evanescent-wave trapped atomic gyroscope (at least one atomic gyroscope) 100'. For example, the moveable body 112, may have three atomic gyroscopes 100 to measure rate of rotation in each of the X, Y, and Z axes. Each atomic gyroscope 100 may be on or in the moveable object.

The moveable body 112 may be a vehicle (e.g. an aircraft, helicopter, drone, missile, spacecraft, ship, submarine, or any other type of vehicle), robot, a human, clothes, or any other type of living thing or inanimate object.

Figure 2:
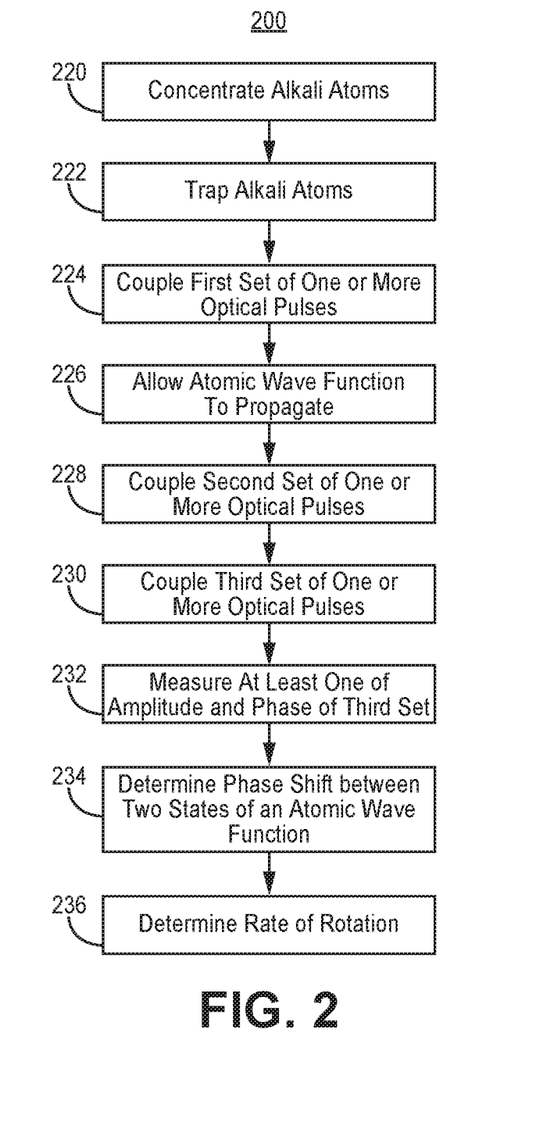
FIG. 2 illustrates an exemplary method of operation of a circular resonator evanescent-wave trapped atomic gyroscope.

FIG. 2 illustrates an exemplary method 200 of operation of a circular resonator evanescent-wave trapped atomic gyroscope. To the extent the method 200 shown in FIG. 2 is described herein as being implemented in the devices described above with respect to FIGS. 1A and B, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 220, concentrate cold alkali atoms around a circumferential surface of a circular resonator. In block 222, trap alkali atoms and their respective atomic wave function around the circumferential surface of the circular resonator and displaced from the circumferential surface of the circular resonator.

In block 224, couple a first set of one or more optical pulses to the circular resonator. The first set of one or more optical pulses may be Bragg or Raman pulses. The first set of at least one optical pulse has an amplitude, phase, and frequency so that a first evanescent field is created around the circumferential surface of the circular resonator which splits the atomic wave function of the alkali atoms into two portions, where one portion has a first state and the other portion has a second state.

The different states are different electronic states if Raman pulses are applied and different motional states if Bragg pulses are applied. If Bragg pulses are applied, then each portion of the atomic wave function propagates around the circumferential surface of the circular resonator in a direction opposite to the other portion.

In block 226, allow the atomic wave function to propagate for a period of time, and thus at least once, around the circumferential surface of the circular resonator. In block 228, couple a second set of one or more optical pulses to the circular resonator. The second set of pulses may be Bragg or Raman pulses. The second set of pulses of at least one optical pulse has an amplitude, phase, and frequency so that a second evanescent field is created around the circumferential surface of circular resonator which causes the two states of the atomic wave function of the alkali atoms to have a ratio dependent upon the rate of rotation around a center axis of the circular resonator.

In block 230, couple a third set of one or more optical pulses to the circular resonator. These pulses are designed to have transmitted or scattered light that is dependent on the atomic states, motional or electronic, of the atoms after the second set of optical pulses. In block 232, measure at least one of an amplitude and a phase of the third set of one or more optical pulses transmitted and/or scattered by the circular resonator.

In block 234, determine a phase shift between the two states of the atomic wave function corresponding to a rate of rotation of the circular resonator around the center axis based upon the at least one an optical amplitude and optical phase measured by the at least one optical detector. In block 236, determine a rate of rotation around the center axis of the circular resonator using the determined phase shift.

Terms of relative position as used in this application are defined based on a plane parallel to the conventional plane or working surface of a device, layer, wafer, or substrate, regardless of orientation. The term "horizontal" or "lateral" as used in this application are defined as a plane parallel to the conventional plane or working surface of a device, layer, wafer, or substrate, regardless of orientation. The term "vertical" refers to a direction perpendicular to the horizontal. Terms such as "on," "side" (as in "sidewall"), "higher," "lower," "over," "top," and "under" are defined with respect to the conventional plane or working surface being on the top surface of a device, layer, wafer, or substrate, regardless of orientation. The term "coplanar" as used in this application is defined as a plane in the same plane as the conventional plane or working surface of a device, layer, wafer, or substrate, regardless of orientation.

Example Embodiments

Example 1 includes an atomic gyroscope, comprising: an atomic trap comprising at least one laser; a circular resonator, comprising a center axis and a circumferential surface around the center axis, within the atomic trap; alkali atoms within the atomic trap and around the circular resonator; wherein the atomic trap is configured to concentrate the alkali atoms by the circumferential surface of the circular resonator; at least one optical waveguide, where at least a portion of the at least one optical waveguide is parallel to a portion of the circumferential surface; a first optical source, comprising at least one laser, optically coupled to the at least one optical waveguide and configured to generate a first continuous wave (CW) signal at a first frequency; a second optical source, comprising at least one laser, optically coupled to the at least one optical waveguide and configured to generate a second CW signal at a second frequency; wherein the first CW signal and the second CW signal are configured to trap the alkali atoms and their respective atomic wave function around the circumferential surface and displaced from the circumferential surface; a third optical source, comprising at least one laser, optically coupled to a first end of the at least one of the at least one optical waveguide and configured to sequentially generate a first set of one or more optical pulses, a second set of optical pulses, and a third set of one or more optical pulses; wherein the first set of at least one optical pulse has an amplitude, phase, and frequency so that a first evanescent field is created around the circumferential surface of circular resonator which causes to split the atomic wave function of the alkali atoms into two portions; wherein one portion has a first state and the other portion has a second state; wherein the second set of at least one optical pulse has an amplitude, phase, and frequency so that a second evanescent field is created around the circumferential surface of circular resonator which causes the two states of the atomic wave function of the alkali atoms to have a ratio dependent upon a rate of rotation around a center axis of the circular resonator; wherein the third set of at least one optical pulse has an amplitude, phase and frequency so that the amplitude or the phase of transmitted light or the amplitude of scattered light are dependent on a population ratio of the two portions of the atomic wave function of the alkali atoms; at least one optical detector, where each of the at least one optical detector is configured to at least one of: (a) coupled to a second end of at least one optical waveguide and (b) by one or more surfaces of the circular resonator; and processing circuitry, coupled to the at least one optical detector, configured to determine: a population ratio of the two portions of the atomic wave function of the alkali atoms based upon at least one of an optical amplitude and optical phase of the set of third optical pulses measured by the at least one optical detector; a phase shift between the states of the two portions of the atomic wave function based upon the determined population ratio; and the rate of rotation around the center axis of the circular resonator based upon the determined phase shift.

Example 2 includes the atomic gyroscope of Example 1, wherein the circular resonator is a toroidal resonator.

Example 3 includes the atomic gyroscope of any of Examples 1-2, wherein the output of the third optical source is coupled to the at least one detector.

Example 4 includes the atomic gyroscope of any of Examples 1-3, wherein each portion propagates around the circumferential surface of the circular resonator in a direction opposite to the other portion.

Example 5 includes the atomic gyroscope of any of Examples 1-4, wherein the atomic trap consists of one of a magneto-optical trap and an optical dipole trap.

Example 6 includes the atomic gyroscope of any of Examples 1-5, wherein the at least one detector comprises an amplitude detector.

Example 7 includes the atomic gyroscope of any of Examples 1-6, wherein the first set of one or more optical pulses, the second set of optical pulses, and the third set of one or more optical pulses comprise Raman pulses; and wherein the first and second states are different electronic states of the alkali atoms.

Example 8 includes the atomic gyroscope of any of Examples 1-7, wherein the fundamental frequency of at least one of the first set, the second set, and the third set is equal to a resonant frequency of the circular resonator.

Example 9 includes a method, comprising: condensing cold alkali atoms around a circumferential surface of a circular resonator; trapping alkali atoms and their respective atomic wave function around the circumferential surface of the circular resonator and displaced from the circumferential surface of the circular resonator; coupling a first set of at least one optical pulse to the circular resonator; wherein the first set of at least one optical pulse has an amplitude, phase, and frequency so that a first evanescent field is created around the circumferential surface of the circular resonator which splits the atomic wave function of the alkali atoms into two portions; wherein one portion has a first state and the other portion has a second state; allowing the portions of the atomic wave function to propagate at least once around the circumferential surface of the circular resonator; coupling a second set of at least one optical pulse to the circular resonator; wherein the second set of at least one optical pulse has an amplitude, phase, and frequency so that a second evanescent field is created around the circumferential surface of circular resonator which causes the two states of the atomic wave function of the alkali atoms to have a ratio dependent upon a rate of rotation around a center axis of the circular resonator; coupling a third set of at least one optical pulse to the circular resonator; wherein the third set of at least one optical pulse has an amplitude, phase and frequency so that the amplitude or the phase of transmitted light or the amplitude of scattered light are dependent on a population ratio of the two portions of the atomic wave function of the alkali atoms; measuring at least one of an optical amplitude and an optical phase of the third set of the at least one optical pulse that have been at least one of: transmitted and scattered by the circular resonator; determining a phase shift between the two portions of the atomic wave function corresponding to a rate of rotation around the center axis of the circular resonator around the center axis based upon the at least one an optical amplitude and optical phase measured by the at least one optical detector; and determining a rate of rotation using the determined phase shift.

Example 10 includes the method of Example 9, wherein the circular resonator is a toroidal resonator.

Example 11 includes the method of any of Examples 9-10, wherein each portion propagates around the circumferential surface of the circular resonator in a direction opposite to the other portion.

Example 12 includes the method of any of Examples 9-11, wherein the first set of one or more optical pulses, the second set of optical pulses, and the third set of one or more optical pulses comprise Raman pulses; and wherein the first and second states are different electronic states of the alkali atoms.

Example 13 includes a system, comprising: a movable object; an atomic microscope, comprising: an atomic trap comprising at least one laser; a circular resonator, comprising a center axis and a circumferential surface around the center axis, within the atomic trap; alkali atoms within the atomic trap and around the circular resonator; wherein the atomic trap is configured to concentrate the alkali atoms by the circumferential surface of the circular resonator; at least one optical waveguide, where at least a portion of the at least one optical waveguide is parallel to a portion of the circumferential surface; a first optical source, comprising at least one laser, optically coupled to the at least one optical waveguide and configured to generate a first continuous wave (CW) signal at a first frequency; a second optical source, comprising at least one laser, optically coupled to the at least one optical waveguide and configured to generate a second CW signal at a second frequency; wherein the first CW signal and the second CW signal are configured to trap the alkali atoms and their respective atomic wave function around the circumferential surface and displaced from the circumferential surface; a third optical source, comprising at least one laser, optically coupled to a first end of the at least one of the at least one optical waveguide and configured to sequentially generate a first set of one or more optical pulses, a second set of optical pulses, and a third set of one or more optical pulses; wherein the first set of at least one optical pulse has an amplitude, phase, and frequency so that a first evanescent field is created around the circumferential surface of circular resonator which causes to split the atomic wave function of the alkali atoms into two portions; wherein one portion has a first state and the other portion has a second state; wherein the second set of at least one optical pulse has an amplitude, phase, and frequency so that a second evanescent field is created around the circumferential surface of circular resonator which causes the two states of the atomic wave function of the alkali atoms to have a ratio dependent upon a rate of rotation around a center axis of the circular resonator; wherein the third set of at least one optical pulse has an amplitude, phase and frequency so that the amplitude or the phase of transmitted light or the amplitude of scattered light are dependent on a population ratio of the two portions of the atomic wave function of the alkali atoms; at least one optical detector, where each of the at least one optical detector is configured to at least one of: (a) coupled to a second end of at least one optical waveguide and (b) by one or more surfaces of the circular resonator; and processing circuitry, coupled to the at least one optical detector, configured to determine: a population ratio of the two portions of the atomic wave function of the alkali atoms based upon at least one of an optical amplitude and optical phase of the set of third optical pulses measured by the at least one optical detector; a phase shift between the states of the two portions of the atomic wave function based upon the determined population ratio; and the rate of rotation around the center axis of the circular resonator based upon the determined phase shift.

Example 14 includes the system of Example 13, wherein the circular resonator is a toroidal resonator.

Example 15 includes the system of any of Examples 13-14, wherein the output of the third optical source is coupled to the at least one detector.

Example 16 includes the system of any of Examples 13-15, wherein each portion propagates around the circumferential surface of the circular resonator in a direction opposite to the other portion.

Example 17 includes the atomic gyroscope of any of Example 13, wherein the atomic trap consists of one of a magneto-optical trap and an optical dipole trap.

Example 18 includes the system of any of Examples 13-17, wherein the at least one detector comprises an amplitude detector.

Example 19 includes the system of any of Examples 13-18, wherein the first set of one or more optical pulses, the second set of optical pulses, and the third set of one or more optical pulses comprise Raman pulses; and wherein the first and second states are different electronic states of the alkali atoms.

Example 20 includes the system of any of Examples 13-19, wherein the fundamental frequency of at least one of the first set, the second set, and the third set is equal to a resonant frequency of the circular resonator.

A number of examples defined by the following claims have been described. Nevertheless, it will be understood that various modifications to the described examples may be made without departing from the spirit and scope of the claimed invention. Therefore, it is manifestly intended that this invention be limited only by the claims and the equivalents thereof.

What is claimed is:
1. An atomic gyroscope, comprising:
an atomic trap comprising at least one laser;
a circular resonator, comprising a center axis and a circumferential surface around the center axis, within the atomic trap;
alkali atoms within the atomic trap and around the circular resonator;
wherein the atomic trap is configured to concentrate the alkali atoms by the circumferential surface of the circular resonator;
at least one optical waveguide, where at least a portion of the at least one optical waveguide is parallel to a portion of the circumferential surface;
a first optical source, comprising at least one laser, optically coupled to the at least one optical waveguide and configured to generate a first continuous wave (CW) signal at a first frequency;
a second optical source, comprising at least one laser, optically coupled to the at least one optical waveguide and configured to generate a second CW signal at a second frequency;
wherein the first CW signal and the second CW signal are configured to trap the alkali atoms and their respective atomic wave function around the circumferential surface and displaced from the circumferential surface;
a third optical source, comprising at least one laser, optically coupled to a first end of the at least one of the at least one optical waveguide and configured to sequentially generate a first set of one or more optical pulses, a second set of optical pulses, and a third set of one or more optical pulses;
wherein the first set of at least one optical pulse has an amplitude, phase, and frequency so that a first evanescent field is created around the circumferential surface of circular resonator which causes to split the atomic wave function of the alkali atoms into two portions;
wherein one portion has a first state and the other portion has a second state;
wherein the second set of at least one optical pulse has an amplitude, phase, and frequency so that a second evanescent field is created around the circumferential surface of circular resonator which causes the two states of the atomic wave function of the alkali atoms to have a ratio dependent upon a rate of rotation around a center axis of the circular resonator;
wherein the third set of at least one optical pulse has an amplitude, phase and frequency so that the amplitude or the phase of transmitted light or the amplitude of scattered light are dependent on a population ratio of the two portions of the atomic wave function of the alkali atoms;
at least one optical detector, where each of the at least one optical detector is configured to at least one of: (a) coupled to a second end of at least one optical waveguide and (b) by one or more surfaces of the circular resonator; and
processing circuitry, coupled to the at least one optical detector, configured to determine:
a population ratio of the two portions of the atomic wave function of the alkali atoms based upon at least one of an optical amplitude and optical phase of the set of third optical pulses measured by the at least one optical detector;
a phase shift between the states of the two portions of the atomic wave function based upon the determined population ratio; and
the rate of rotation around the center axis of the circular resonator based upon the determined phase shift.

2. The atomic gyroscope of claim 1, wherein the circular resonator is a toroidal resonator.

3. The atomic gyroscope of claim 1, wherein the output of the third optical source is coupled to the at least one detector.

4. The atomic gyroscope of claim 1, wherein each portion propagates around the circumferential surface of the circular resonator in a direction opposite to the other portion.

5. The atomic gyroscope of claim 1, wherein the atomic trap consists of one of a magneto-optical trap and an optical dipole trap.

6. The atomic gyroscope of claim 1, wherein the at least one detector comprises an amplitude detector.

7. The atomic gyroscope of claim 1, wherein the first set of one or more optical pulses, the second set of optical pulses, and the third set of one or more optical pulses comprise Raman pulses; and
wherein the first and second states are different electronic states of the alkali atoms.

8. The atomic gyroscope of claim 1, wherein the fundamental frequency of at least one of the first set, the second set, and the third set is equal to a resonant frequency of the circular resonator.

9. A method, comprising:
condensing cold alkali atoms around a circumferential surface of a circular resonator;
trapping alkali atoms and their respective atomic wave function around the circumferential surface of the circular resonator and displaced from the circumferential surface of the circular resonator;
coupling a first set of at least one optical pulse to the circular resonator;
wherein the first set of at least one optical pulse has an amplitude, phase, and frequency so that a first evanescent field is created around the circumferential surface of the circular resonator which splits the atomic wave function of the alkali atoms into two portions;
wherein one portion has a first state and the other portion has a second state;
allowing the portions of the atomic wave function to propagate at least once around the circumferential surface of the circular resonator;
coupling a second set of at least one optical pulse to the circular resonator;
wherein the second set of at least one optical pulse has an amplitude, phase, and frequency so that a second evanescent field is created around the circumferential surface of circular resonator which causes the two states of the atomic wave function of the alkali atoms to have a ratio dependent upon a rate of rotation around a center axis of the circular resonator;
coupling a third set of at least one optical pulse to the circular resonator;
wherein the third set of at least one optical pulse has an amplitude, phase and frequency so that the amplitude or the phase of transmitted light or the amplitude of scattered light are dependent on a population ratio of the two portions of the atomic wave function of the alkali atoms;
measuring at least one of an optical amplitude and an optical phase of the third set of the at least one optical pulse that have been at least one of: transmitted and scattered by the circular resonator;
determining a phase shift between the two portions of the atomic wave function corresponding to a rate of rotation around the center axis of the circular resonator around the center axis based upon the at least one an optical amplitude and optical phase measured by the at least one optical detector; and
determining a rate of rotation using the determined phase shift.

10. The method of claim 9, wherein the circular resonator is a toroidal resonator.

11. The method of claim 9, wherein each portion propagates around the circumferential surface of the circular resonator in a direction opposite to the other portion.

12. The method of claim 9, wherein the first set of one or more optical pulses, the second set of optical pulses, and the third set of one or more optical pulses comprise Raman pulses; and
wherein the first and second states are different electronic states of the alkali atoms.

13. A system, comprising:
a movable object;
an atomic microscope, comprising:
an atomic trap comprising at least one laser;
a circular resonator, comprising a center axis and a circumferential surface around the center axis, within the atomic trap;
alkali atoms within the atomic trap and around the circular resonator;
wherein the atomic trap is configured to concentrate the alkali atoms by the circumferential surface of the circular resonator;
at least one optical waveguide, where at least a portion of the at least one optical waveguide is parallel to a portion of the circumferential surface;
a first optical source, comprising at least one laser, optically coupled to the at least one optical waveguide and configured to generate a first continuous wave (CW) signal at a first frequency;
a second optical source, comprising at least one laser, optically coupled to the at least one optical waveguide and configured to generate a second CW signal at a second frequency;
wherein the first CW signal and the second CW signal are configured to trap the alkali atoms and their respective atomic wave function around the circumferential surface and displaced from the circumferential surface;
a third optical source, comprising at least one laser, optically coupled to a first end of the at least one of the at least one optical waveguide and configured to sequentially generate a first set of one or more optical pulses, a second set of optical pulses, and a third set of one or more optical pulses;
wherein the first set of at least one optical pulse has an amplitude, phase, and frequency so that a first evanescent field is created around the circumferential surface of circular resonator which causes to split the atomic wave function of the alkali atoms into two portions;
wherein one portion has a first state and the other portion has a second state;
wherein the second set of at least one optical pulse has an amplitude, phase, and frequency so that a second evanescent field is created around the circumferential surface of circular resonator which causes the two states of the atomic wave function of the alkali atoms to have a ratio dependent upon a rate of rotation around a center axis of the circular resonator;
wherein the third set of at least one optical pulse has an amplitude, phase and frequency so that the amplitude or the phase of transmitted light or the amplitude of scattered light are dependent on a population ratio of the two portions of the atomic wave function of the alkali atoms;

at least one optical detector, where each of the at least one optical detector is configured to at least one of: (a) coupled to a second end of at least one optical waveguide and (b) by one or more surfaces of the circular resonator; and processing circuitry, coupled to the at least one optical detector, configured to determine:

a population ratio of the two portions of the atomic wave function of the alkali atoms based upon at least one of an optical amplitude and optical phase of the set of third optical pulses measured by the at least one optical detector;

a phase shift between the states of the two portions of the atomic wave function based upon the determined population ratio; and the rate of rotation around the center axis of the circular resonator based upon the determined phase shift.

14. The system of claim 13, wherein the circular resonator is a toroidal resonator.

15. The system of claim 13, wherein the output of the third optical source is coupled to the at least one detector.

16. The system of claim 13, wherein each portion propagates around the circumferential surface of the circular resonator in a direction opposite to the other portion.

17. The atomic gyroscope of claim 13, wherein the atomic trap consists of one of a magneto-optical trap and an optical dipole trap.

18. The system of claim 13, wherein the at least one detector comprises an amplitude detector.

19. The system of claim 13, wherein the first set of one or more optical pulses, the second set of optical pulses, and the third set of one or more optical pulses comprise Raman pulses; and wherein the first and second states are different electronic states of the alkali atoms.

20. The system of claim 13, wherein the fundamental frequency of at least one of the first set, the second set, and the third set is equal to a resonant frequency of the circular resonator.

* * * * *